United States Patent [19]
Song et al.

[11] Patent Number: 5,691,803
[45] Date of Patent: Nov. 25, 1997

[54] ADVANCED EXPOSURE APPARATUS AND EXPOSURE METHOD USING THE SAME

[75] Inventors: Jae-kwan Song; Jeong-kon Kim; Kyoung-shin Park; Kyung-sung Bae, all of Kyungki-do, Rep. of Korea

[73] Assignee: Samsung Electronics Co., Ltd., Suwon, Rep. of Korea

[21] Appl. No.: 604,302

[22] Filed: Feb. 21, 1996

[30] Foreign Application Priority Data

Jun. 19, 1995 [KR] Rep. of Korea ............ 95-16257

[51] Int. Cl.⁶ .................................... G03B 27/52
[52] U.S. Cl. .................. 355/55; 355/53; 355/67; 355/71
[58] Field of Search ............ 355/53, 54; 359/227, 359/232; 378/147, 150, 151; 250/492.24

[56] References Cited

U.S. PATENT DOCUMENTS

5,348,837  9/1994  Fukuda et al. ................. 355/53
5,357,311  10/1994  Shiraishi ......................... 355/53
5,552,856  9/1996  Shiraishi et al. ................. 355/53

*Primary Examiner*—Arthur T. Grimley
*Assistant Examiner*—Shival Virmani
*Attorney, Agent, or Firm*—Cushman Darby & Cushman, IP Group of Pillsbury Madison & Sutro LLP

[57] ABSTRACT

An advanced exposure apparatus combines a quadrupole illumination system and an annular illumination system, and includes a light source, an adjusting portion comprising a filter to limit the light emitted from the light source, a refractive/diffractive portion for refracting and diffracting the light emitted from the adjusting portion and a focussing portion for focussing the light emitted from the refractive/diffractive portion onto a wafer, wherein the filter is provided with first group holes and second group holes comprising four holes, respectively. In an exposure method using such an apparatus, uniform light intensity distribution can be formed on an image formation plane (or wafer) while improved resolution is maintained. Since image formation information (i.e, light passing through a mask pattern) becomes uniform, a very nearly circular contact hole pattern can be formed, to reduce the proximity effect.

8 Claims, 7 Drawing Sheets

ADVANCED EXPOSURE APPARATUS AND EXPOSURE METHOD USING THE SAME

BACKGROUND OF THE INVENTION

The present invention relates to an advanced exposure apparatus and an exposure method using the same, and more particularly, to an illumination system which combines a quadrupole illumination system and an annular illumination system.

When the design rule for a semiconductor device becomes less than 0.35 µm, conventional exposure technology using an i-line cannot satisfy the resolution and depth-of-focus requirements for fine pattern formation of the semiconductor device. This makes it very difficult to develop product in the mass-production of the semiconductor device. Hence, various lithography technologies are used, which include a patterning technology using an advanced exposure apparatus. For in line pattern formation on a photo sensitive film doped on a stepped structure, a conventional advanced exposure apparatus forms an incomplete line pattern. Also, a detrimental proximity effect is generated, whereby the resolutions are different in the center and edges of a formed line; i.e., low resolution along the edge portion. Thus, a contact hole cannot be properly formed by the conventional advanced exposure apparatus.

In the conventional advanced exposure apparatus, because zero-order and +1st-order diffracted beams are used, the resolution and depth-of-focus of exposure apparatus is improved. Theoretically, the resolution of the conventional advanced exposure apparatus is 50% higher than that of the conventional exposure apparatus, given the same light wavelength ($\lambda$) and numerical aperture (NA).

A conventional exposure apparatus including a fly's eye lens, a condenser lens, and a filter between the lenses, and an exposure method using the same, will be explained in detail with reference to FIGS. 1–4.

Figure 1:
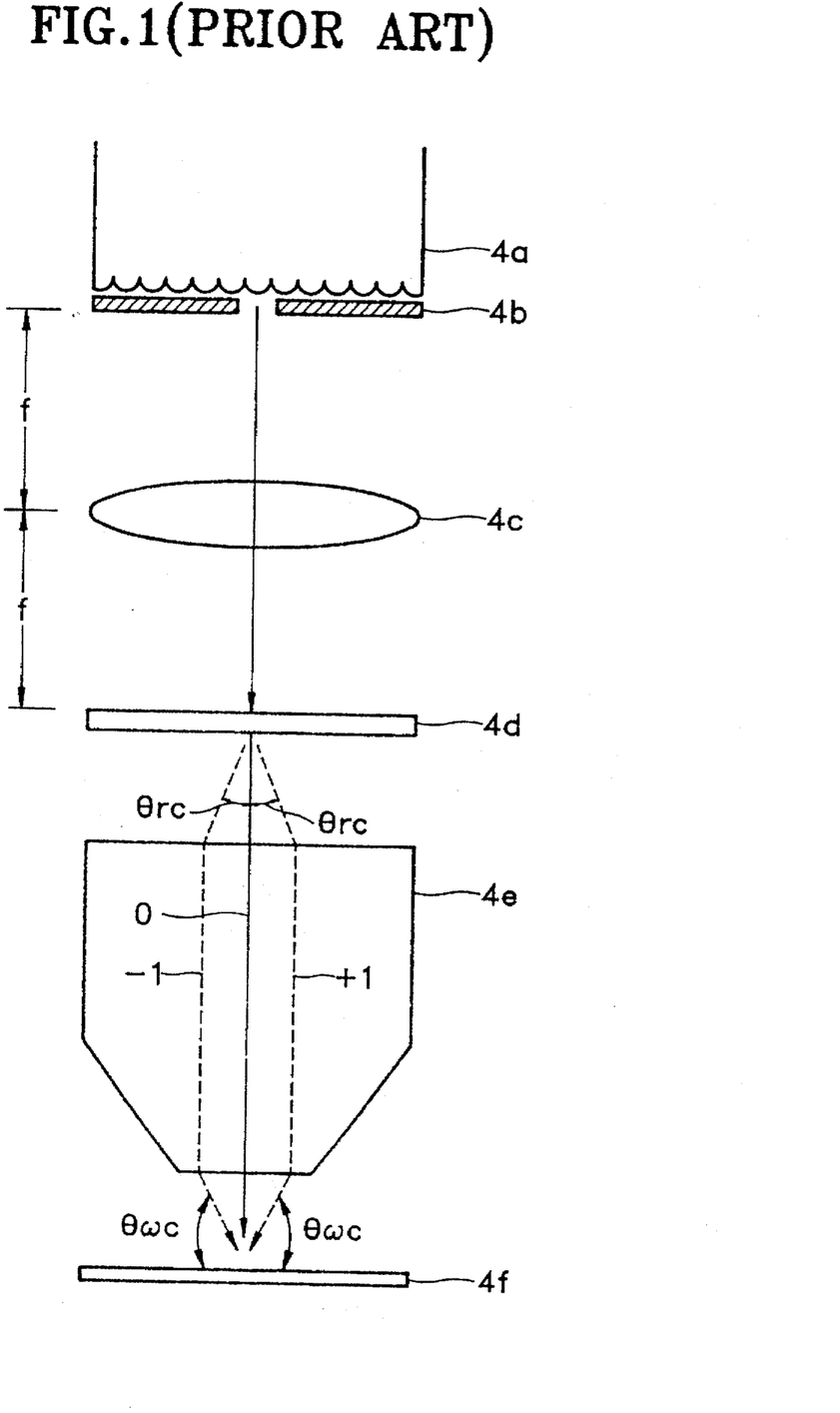
FIG. 1 shows a conventional exposure apparatus.

FIG. 1 shows a conventional exposure apparatus including fly's eye lens 4a, filter 4b, condenser lens 4c, having a focal distance f, mask pattern 4d and projection lens 4e. In the illumination method using the described exposure apparatus, light irradiated from a light source (not shown) passes through lens 4a, and is limited by filter 4b. Filter 4b coincides with a Fourier transform plane of mask pattern 4d via condenser lens 4c.

Figure 7A:
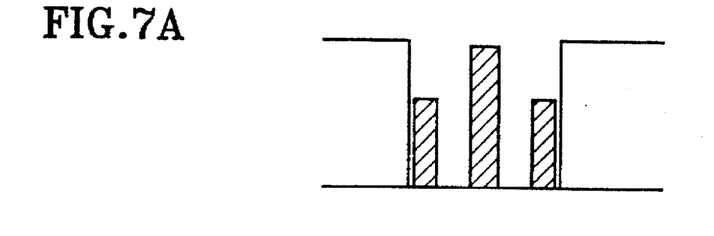
FIG. 7 and 8 show the exposure intensity distribution of the prior art.
Figure 7B:
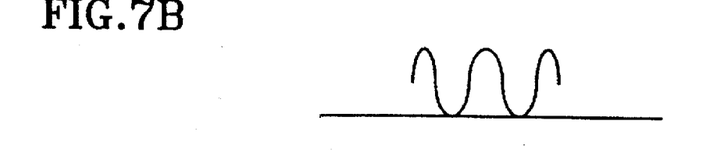

As shown in FIG. 1, a zero-order (0) diffracted beam of illuminated light on the Fourier transform plane is incident on projection lens 4e vertically and +1st and −1st order diffracted beams (−1 and +1) are incident to projection lens 4e with an angle of $\theta_{rc}$ (tilted component.) Accordingly, zero-order, +1st and −1st diffracted lights are interfered with one another on a wafer 4f to thereby reform the intensity distribution of the incident light. As shown in FIG. 7, the light intensity distribution on wafer 4f is a discontinuous distribution where a maximum point of light intensity and a minimum point with zero light intensity are clearly distinguished. In FIG. 7, reference number 10 refers to the wafer.

In FIG. 1, the finer mask pattern 4d is, the more diffraction angle $\theta_{rc}$ increases. Accordingly, if sin $\theta_{rc}$ is greater than the NA, non zero-order diffracted light deviates from projection lens 4e and only the zero-order diffracted light passed through projection lens 4e arrives on wafer 4f and interference does not occur. At this time, the minimum resolution becomes R=$\lambda$/2NA where $\lambda$ denotes the wavelength of an incident light and NA denotes the numerical aperture.

Figure 2:
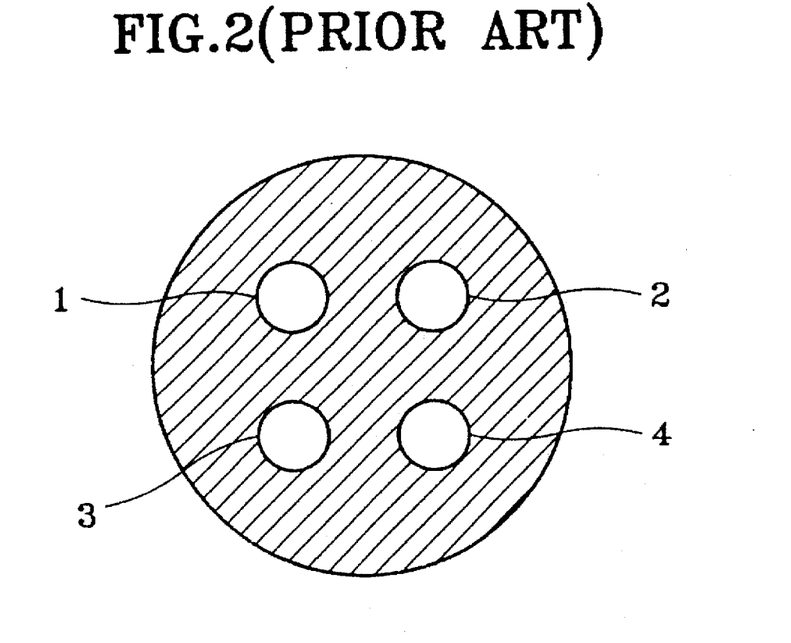
FIGS. 2 and 3 show a quadrupole filter and an annular filter, respectively, both used in the conventional advanced exposure apparatus.
Figure 3:
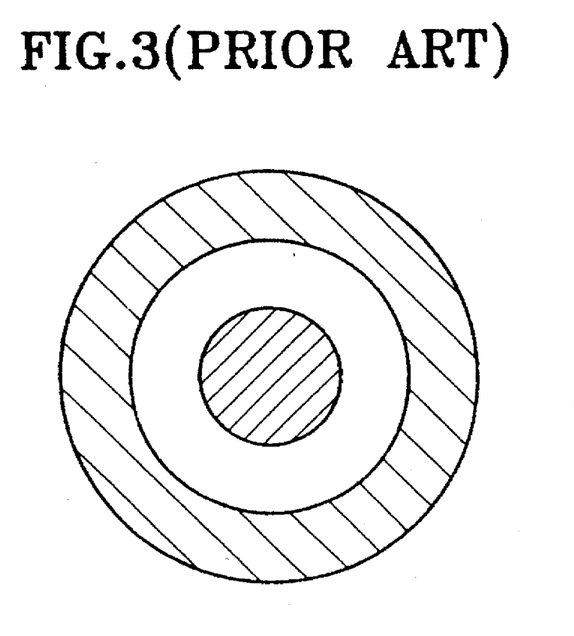

FIGS. 2 and 3 show a quadrupole filter and an annular filter used in the conventional advanced exposure apparatus, respectively.

Figure 4:
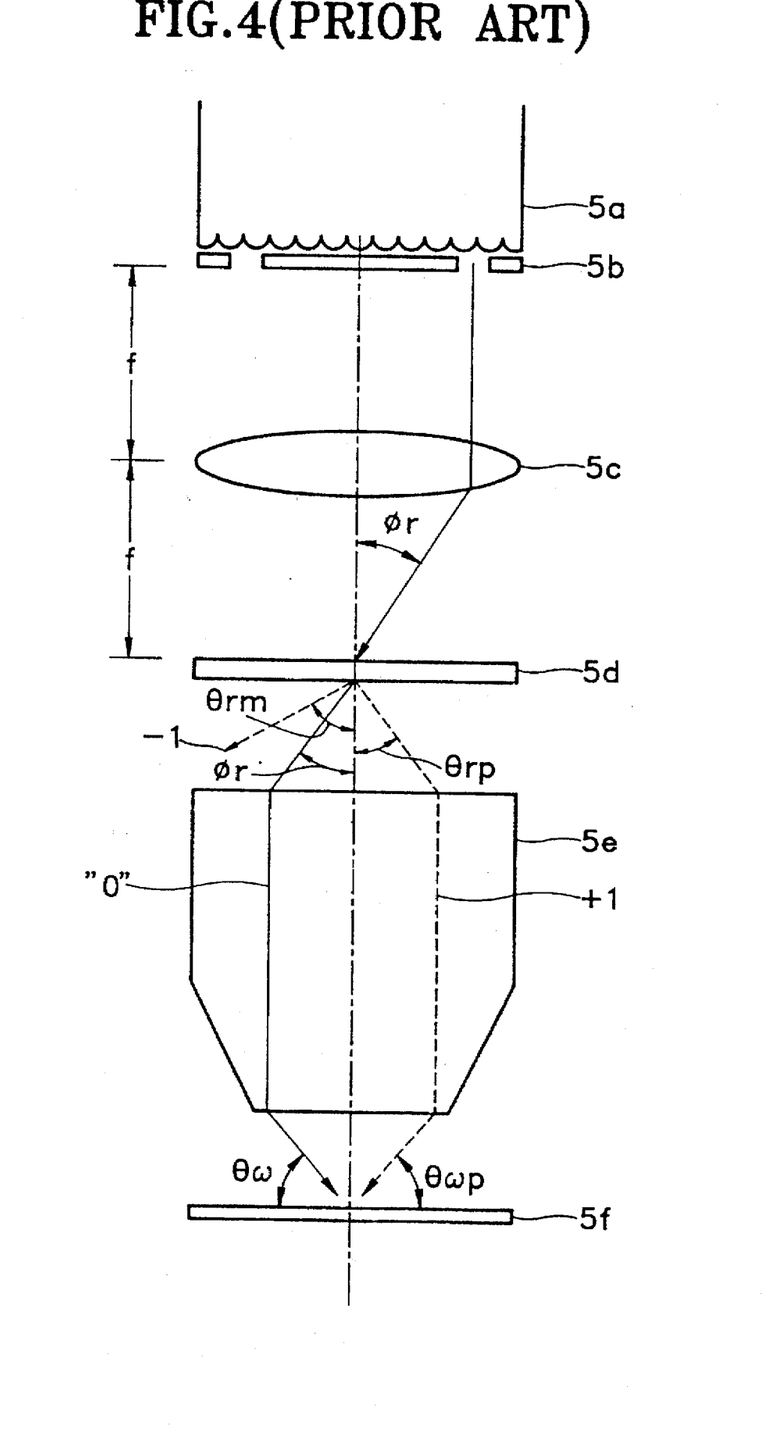
FIG. 4 shows a conventional advanced exposure apparatus including a quadrupole or an annular filter.
Figure 8A:
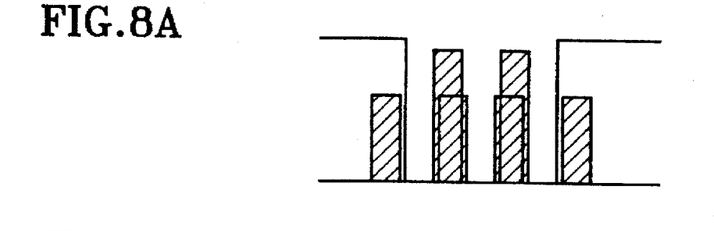
Figure 8B:
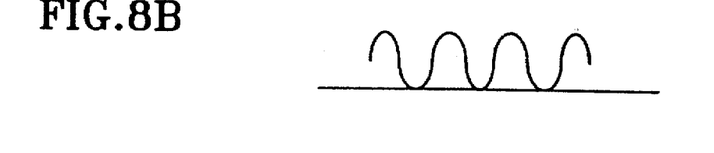

FIG. 4 shows the conventional advanced exposure apparatus using filter 5b which is different from filter 4b used in the conventional exposure apparatus. While the exposure portion of filter 4b is a central portion of condenser lens 4c, in the conventional exposure apparatus, the illumination portion of filter 5b is formed on the edge portion of condenser lens 5c in the conventional advanced exposure apparatus. Accordingly, the light radiated from eye's lens 5a is incident to the edge of the lens in parallel with the optical axis of condenser lens 5c at first. However, while passing through the edge of condenser lens 5c, the light is refracted by condenser lens 5c to be incident to a mask pattern 5d with an angle of $\theta_r$ with respect to the optical axis of condenser lens 5c. The diffracted angle of the light incident to mask pattern 5d is determined by the interval of the pattern. Since the NA of mask pattern 5d is greater than sin 2 $\theta_r$, higher order diffracted light not less than −1th order deviates from projection lens 5e and only zero-order and 1st diffracted lights passed through projection lens 5e arrive on wafer 5f to interfere with each other, thereby resulting in reformation of the optical energy distribution. As shown in FIG. 8, such a reformed light intensity distribution on the wafer is a continuous distribution but the light intensity between maximum point and minimum point is negligible. In FIG. 8, reference number 20 refers to wafer 5f. The light intensity distribution by the conventional advanced exposure apparatus is generally non-uniform on the wafer.

Since zero-order and +1st lights are unformly distributed in the neighborhood of the center of projection lens 5e in FIG. 4, phase changes due to defocusing are identical in zero-order and +1st lights and thus there is no phase change to have a greater depth-of-focus than that obtained by the conventional exposure apparatus. At this time, the resolution becomes R=$\lambda$/{2(NA+sin $\theta_r$)}, and with the expectation of five times the projection enlargement, if sin $\theta_r$=NA/2, the resolution limit of wafer 5f becomes $$R = \frac{\lambda}{2\left(NA + \frac{NA}{2}\right)}$$

$$= \frac{\lambda}{3NA}$$

and denotes a resolution which is 1.5 times the resolution of the conventional exposure apparatus.

As fully described above, in the conventional quadrupole illumination system, the area of the exposure portion of the filter is much smaller than that of shutting down the light of the filter. Accordingly, the exposure time lengthens.

As described above, since the conventional advanced exposure apparatus shuts down the part of the light by the filter, an exposure amount is too small at the time of the advanced exposure and thus the exposure time markedly lengthens, the illumination apparatus malfunctions and the uniformity of the light intensity distribution lowers. Also, since the light intensity distribution is not uniform on an image formation plane in the conventional advanced exposure apparatus, the information of the light passing through the edge of the mask pattern is considerably lost. Accordingly, the contact hole pattern cannot be properly formed by the conventional advanced exposure apparatus. It is very hard to apply the conventional advanced apparatus to a production field due to the asymmetry and the reduction of an edge line and the interval difference between the edge line and the central line of a line pattern because of the proximity effect, a scum generation because of the incomplete removal of photoresist and the formation of an asymmetrical V-shaped notch between lines, and the degradation of a tilted line and an isolated pattern.

SUMMARY OF THE INVENTION

It is an object of the present invention to solve the above problems and to provide an advanced exposure apparatus with a combined filter capable of forming a uniform light intensity distribution while the light intensity is maximized in an image formation region.

It is another object of the present invention to provide a method using the advanced exposure apparatus.

To accomplish the above object, there is provided an advanced exposure apparatus of the present invention comprising: a light source; an adjusting portion comprising a filter to limit the light emitted from said light source portion; a refractive/diffractive portion for refracting and diffracting the light emitted from said adjusting portion; and a focussing portion for focussing the light emitted from said refractive/diffractive portion onto a wafer, wherein said filter is provided with first group holes and second group holes, the size of the holes being the same, but the distance from the center of the filter being different for each group of holes. Here, the first and second group holes consist of four holes, respectively. Therefore the filter has eight exposure holes Also, the light source portion is a fly's eye lens and the adjusting portion is a filter formed by combining a conventional quadrupole filter and an annular filter. The means for refracting the light emitted from the adjusting portion is a condenser lens and the diffracting means is a mask pattern. The condensing portion is a projection lens.

To accomplish the other object, there is provided an exposure method, using the advanced exposure apparatus of the present invention, including the steps of: generating near-off axis light and far-off axis light; making the light obliquely incident to the mask pattern; and focussing the light emitted from the mask pattern onto the wafer.

Here, the near-off axis light and far-off axis light are both generated by the above described filter of the advanced exposure apparatus.

The filter used in the advanced exposure apparatus, according to the present invention, has two off-axis illumination regions. The filter has the same effect as associating a quadrupole filter and annular filter by conventional technology. Therefore, resolution of the advanced exposure apparatus by the present invention is higher than that of a conventional exposure appartus. Also, light intensity becomes uniform on the image formation plane.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 6:
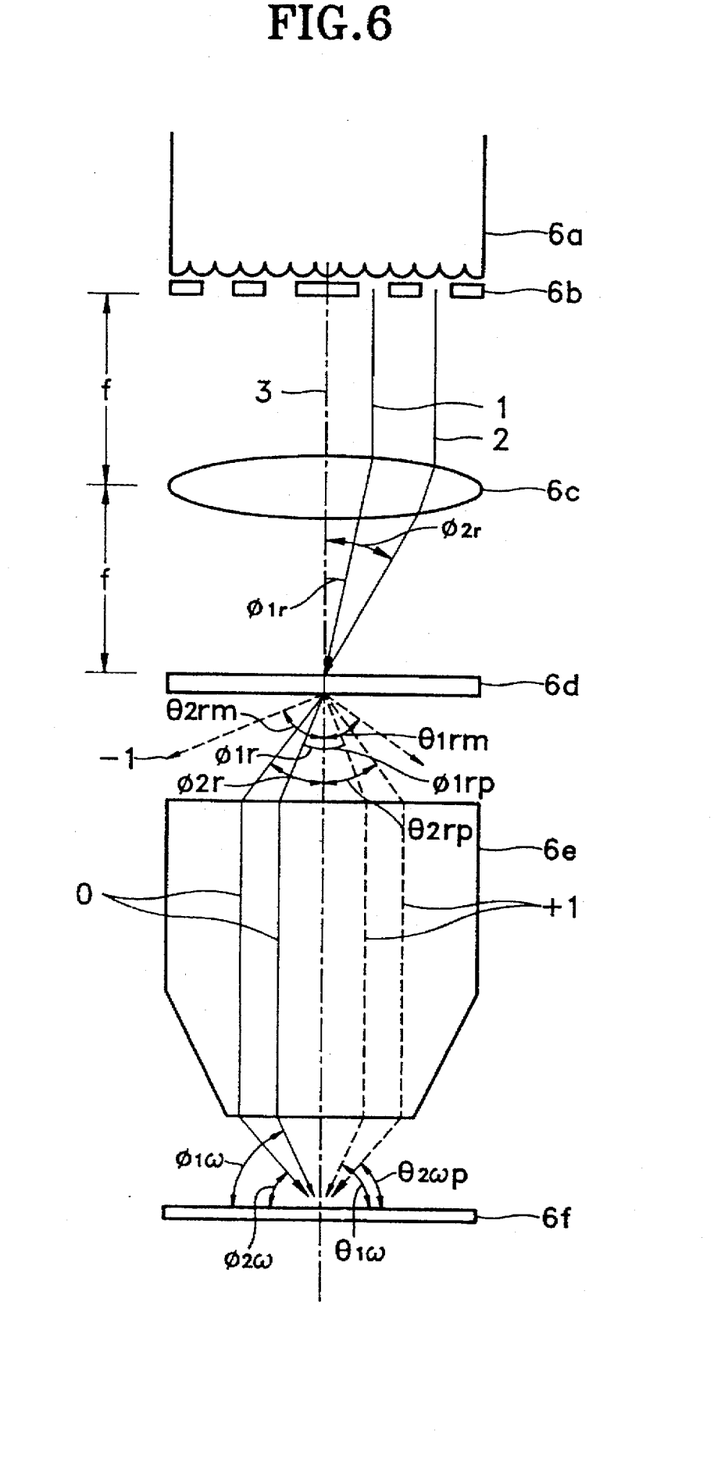
FIG. 6 shows the advanced exposure apparatus according to the present invention.

FIG. 6 shows an advanced exposure apparatus according to the present invention. The advanced exposure apparatus of the present invention includes fly's lens 6a for collimating the light coming from a light source (not shown), filter 6b for limiting the light coming from fly's eye lens 6a, condenser lens 6c with focal distance f for refracting with angle ($\Phi_{1r}$ and $\Phi_{2r}$) with respect to optical axis 3, the light coming from filter 6b, mask pattern 6d for diffracting the light coming from condenser lens 6c and projection lens 6e for focusing the light diffracted by mask pattern 6d on wafer 6f.

Figure 5:
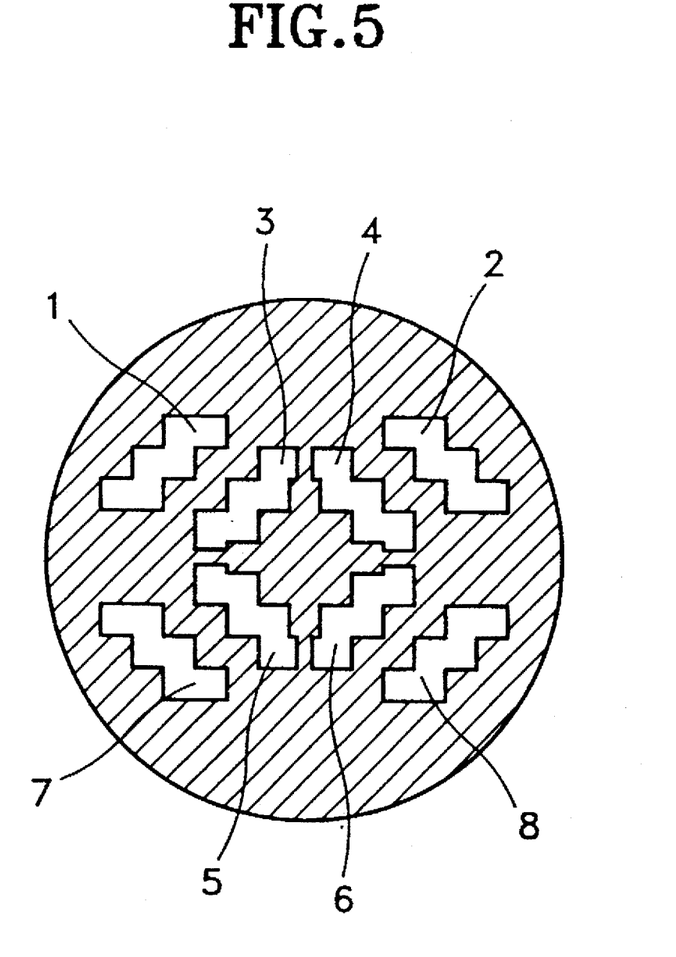
FIG. 5 shows a filter used in an advanced exposure apparatus according to the present invention.

Filter 6b comprise eight exposure holes (see FIG. 5). According to geometric array form, one eight holes are divided into two groups, that is, first group holes H3, H4, H5, and H6 and second group holes H1, H2, H7, and H8. Thus, the first group holes and the second group holes comprise four holes, respectively. Four holes consisting of the first group holes are formed at a constant distance (hereinafter called the first distance) from the center of the filter and maintain a constant angle with one another. And four holes consisting of the second group holes are formed at a constant distance(hereinafter called the second distance) further from the center of the filter than that of the four holes of the first group holes. And like the first group holes, the four holes consisting of the second group holes maintain a costant angle with one another. The first and the second group holes have the same form, and the same size.

An exposure method by the advanced exposure apparatus of the present invention will now be explained. A far off axis light 2 and a near off axis light 1 are incident to mask pattern 6d by condenser lens 6c with angles of $\Phi_{1r}$ and $\Phi_{2r}$ with respect to optical axis 3 of condenser lens 6c, respectively. By mask pattern 6d, incident light beams 1 and 2 are diffracted with two zero-order, two +1st and two −1st lights 0, 1 and −1. The two −1st lights are diffracted with angles of $\theta_{1rm}$ and $\theta_{2rm}$ with respect to optical axis 3 to thereby deviate from projection lens 6e. Only two zero-order and two +1st lights 0 and 1 are incident to projection lens 6e and then an incident condition is as follows. Namely, the two zero-order beams 0 are incident to projection lens 6e with angles of $\Phi_{1r}$ and $\Phi_{2r}$ with respect to optical axis 3, respectively. Also, two +1st lights 1 are incident to projection lens 6e with angles of $\theta_{1rm}$ and $\theta_{2rm}$ with respect to optical axis 3, respectively. By projection lens 6e, an image of mask pattern 6d is formed on an image formation plane, namely, the image of mask pattern 6d is formed on wafer 6f. Resolutions R1 and R2 by near axis light (1) and far axis light (2) can be expressed by the following equations.

$$R1 = \frac{\lambda}{2(NA_r + \sin\Phi_{1r})},$$

$$R2 = \frac{\lambda}{2(NA_r + \sin\Phi_{2r})}$$

The main equation for determining a limit resolution in the above equations is R2. Accordingly, it is possible to obtain a resolution greater than the resolution limit by a conventional advanced exposure apparatus, by maximizing the light's angle of incidence with respect to mask pattern 6d.

The advanced exposure apparatus of the present invention uses filter 6b having more exposure holes than a conventional quadrupole filter and thus a light intensity distribution which is more uniform than that of the prior art can be formed on the wafer.

If the wavelength of the light passing through the filter 6b is λ, the light intensity distribution on wafer 6f is determined by the following equations.

$$d_{12} \sin \theta_{12} = m\lambda \quad (1)$$

$$d_{13} \sin \theta_{13} = m\lambda \quad (2)$$

$$d_{78} \sin \theta_{78} = m\lambda \quad (28)$$

Here, $d_{ij}$ denotes the distance between selected two holes Hi and Hj among the eight holes of the filter(see FIG. 5), where i≠j here, i={1, 2, ..., 8} and j={1, 2, ..., 8}/ and $\theta_{ij}$ denotes the angle between the light coming from the selected two holes Hi and Hj of the eight holes. As shown by the above equations, the condition that the light intensity becomes maximum on wafer 6f is when m=1, 2, 3 .... Accordingly, the probability where the light intensity at a random point on wafer 6f becomes maximum is $\frac{1}{2}^{28}$. And the condition that the light intensity becomes minimum on wafer 6f is when m=M/2 here, M is an odd number(1, 3, 5, 7, ...). Accordingly the probility where the light intensity at a random point on wafer 6f becomes minimum is $\frac{1}{2}^{28}$, which generates the same probability as that of the maximum.

Since the diffractive light of other wavelengths is formed between the maximum and minimum points of the intensity of the diffractive light on wafer 6f, the distribution of the intensity of the diffractive light on wafer 6f is continuous. Accordingly, in the present invention, the uniform light intensity distribution over a range considerably wider than that of the conventional advanced exposure apparatus is formed on an image formation plane (wafer 6f). Consequently, although the light intensity of the present invention is slightly smaller than that of the conventional advanced exposure apparatus, the uniformity of the light intensity distribution is greatly superior. Also, the light passing through the center and edge of mask pattern 6d has uniform information for forming an image. Accordingly, even in the case of forming a contact hole pattern, the shape of the contact hole can be very nearly circular. Also, most of the problems generated by the proximity effect can be solved.

Figure 9A:
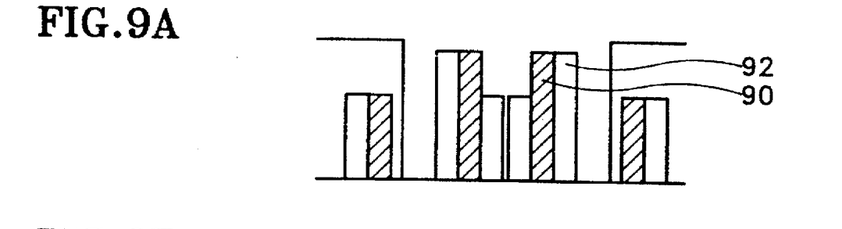
FIGS. 9 shows the exposure intensity distribution of the present invention.
Figure 9B:
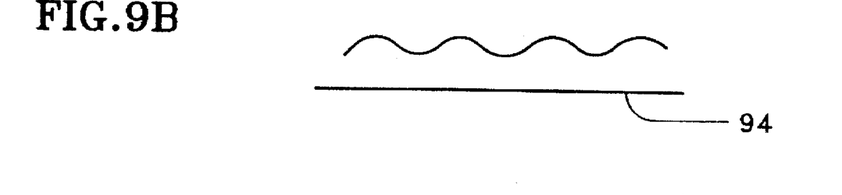

FIG. 9 shows the distribution of the exposure intensity on wafer 94 by the present invention. With reference to FIG. 9 the light intensity distribution exists even in the region corresponding to the minimum point where the light intensity was zero in the conventional advanced exposure apparatus. And the difference between the maximum and minimum light intensity on the wafer, by the present invention, is smaller than that in the prior art. Consequently, the light intensity distribution by an exposure method using the advanced exposure apparatus of the present invention is considerably more uniform than that by an exposure method using the conventional advanced exposure apparatus.

Figure 10:
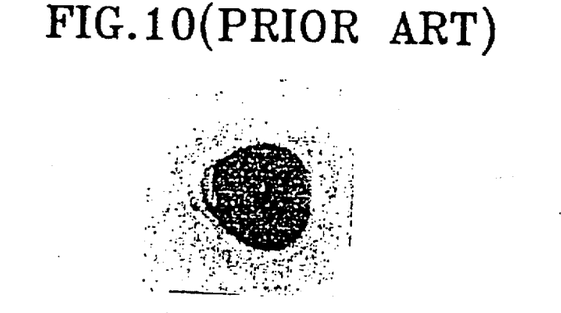
FIGS. 10–12 are SEM photographs of a contact hole formed by the advanced exposure apparatus of the prior art.
Figure 11:
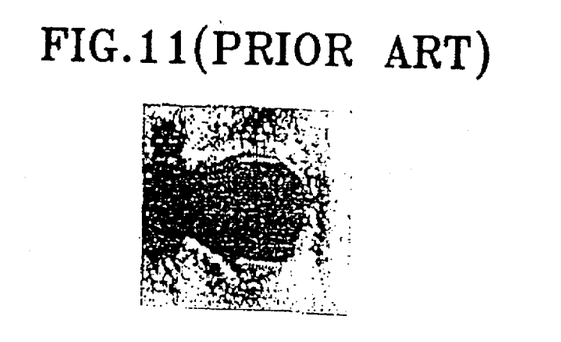
Figure 12:
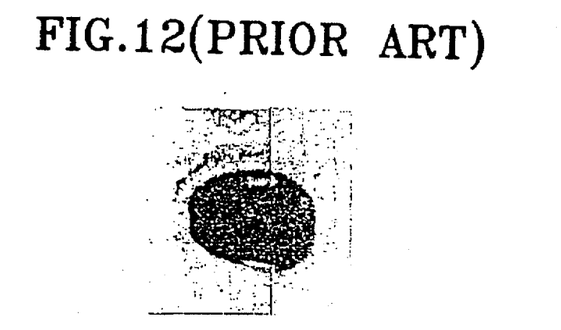
Figure 13:
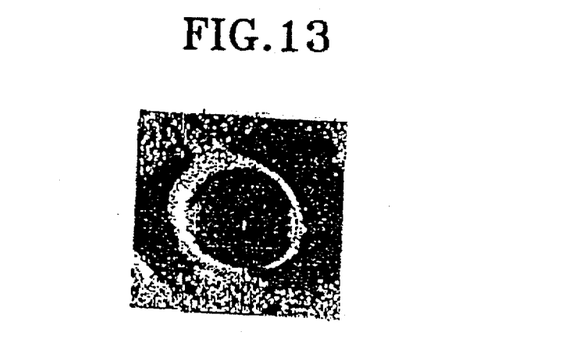
FIG. 13 is a SEM photograph of a contact hole formed by the advanced exposure apparatus of the present invention.

FIGS. 10-12 and FIG. 13 are SEM photographs of the contact hole formed by the advanced exposure apparatus of the prior art and of the present invention, respectively. In FIGS. 10 and 11, the shape of the contact hole (the central black portion) is somewhat triangular, and, as shown in FIG. 12, the shape is rather elliptical. In FIG. 13, on the other hand, the contact hole formed by the present invention is very nearly circular in shape.

As a result, since a filter of the advanced exposure apparatus by the present invention has two off-axis exposure regions. The filter has the same effect as associating a quadrupole filter and annular filter by conventional technology. Therefore, resolution of the advanced exposure apparatus by the present invention is higher than that of a conventional exposure apparatus. Also, the uniform light intensity distribution can be formed in the image formation plane. Image formation information of light passing through the mask pattern has become uniform, to thereby form a contact hole pattern of a nearly circular shape and thus reduce the proximity effect.

The present invention is not limited to the above embodiment and many alterations can be made by those of ordinary skill in the prior art within the technical ideas of the present invention.

What is claimed is:

1. An advanced exposure apparatus comprising:

a light source;

an adjusting portion comprising a filter to limit the light emitted from said light source;

a refractive/diffractive portion for refracting and diffracting the light emitted from said adjusting portion; and a focussing portion for focussing the light emitted from said refractive/diffractive portion onto a wafer, wherein said filter is provided with first group holes and second group holes of the same size, said first group holes being disposed a first distance from the center of said filter and said second group holes being disposed a second distance from the center of said filter, said second distance being greater than said first distance.

2. An advanced exposure apparatus comprising:

a light source;

an adjusting portion comprising a filter to limit the light emitted from said light source, said filter is formed by combining a quadrupole filter and an annular filter;

a refractive/diffractive portion for refracting and diffracting the light emitted from said adjusting portion; and a focussing portion for focussing the light emitted from said refractive/diffractive portion onto a wafer, wherein said filter is provided with first group holes and second group holes of the same size, but differing distances from the center of the filter.

3. An advanced exposure apparatus according to claim 1, wherein said first and second group holes are provided with four holes, respectively.

4. An advanced exposure apparatus according to claim 3, wherein said four holes maintain a constant angle with each other.

5. An advanced exposure apparature according to claim 1, wherein said first group holes and said second group holes are formed at a first distance and a second distance from the center of said filter, respectively.

6. An advanced exposure apparatus according to claim 5, wherein said second distance is further from the center of said filter than said first distance.

7. An exposure method using an advance exposure apparatus comprising the steps of:

generating light radiated from a light source as near-off axis light and far-off axis light, respectively, said near-off axis light being filtered through a first group holes disposed a first distance from the center of a filter and said far-off axis light being filtered through a second group holes disposed a second distance from the center of said filter, said second distance being greater than said first distance;

making said near-off axis light and far-off axis light obliquely incident to a mask pattern; and focussing the light emitted from said mask pattern onto a wafer.

8. An exposure method using an advanced exposure apparatus comprising the steps of:

generating light radiated from a light source as near-off axis light and far-off axis light, using a filter with said first group holes and said second group holes comprising four holes respectively, said filter formed by combining a quadrupole filter and an annular filter;

making said near-off axis light and far-off axis light obliquely incident to a mask pattern; and focussing the light emitted from said mask pattern onto a wafer.

* * * * *